(12) United States Patent
Hausperger et al.

(10) Patent No.: US 7,579,825 B2
(45) Date of Patent: Aug. 25, 2009

(54) DEVICE AND METHOD FOR MEASURING A CURRENT FLOWING IN AN ELECTRICAL CONDUCTOR

(75) Inventors: Christian Hausperger, Bonbruck (DE); Edgar Kindler, Landshut (DE); Bernhard Röllgen, Munich (DE)

(73) Assignees: Lisa Dräxlmaier GmbH, Vilsbiburg (DE); EPCOS AG, Münech (DE)

( * ) Notice: Subject to any disclaimer, the term of this patent is extended or adjusted under 35 U.S.C. 154(b) by 45 days.

(21) Appl. No.: 11/879,046

(22) Filed: Jul. 13, 2007

(65) Prior Publication Data

US 2008/0054898 A1    Mar. 6, 2008

(30) Foreign Application Priority Data

Jul. 14, 2006    (DE)    ........... 10 2006 032 762

(51) Int. Cl.
*G01R 15/20*    (2006.01)
(52) U.S. Cl. .................................. 324/117 H
(58) Field of Classification Search ............. 324/117 H, 324/115, 126–127, 158.1, 117 R, 252; 336/220–222; 323/368
See application file for complete search history.

(56) References Cited

U.S. PATENT DOCUMENTS

| | | | |
|---|---|---|---|
| 5,180,970 A | | 1/1993 | Ross |
| 6,525,504 B1 * | | 2/2003 | Nygren et al. ............ 318/700 |
| 6,700,258 B2 * | | 3/2004 | McMullen et al. ........ 310/90.5 |
| 7,005,876 B2 * | | 2/2006 | Wei et al. .................. 324/765 |
| 7,332,903 B2 * | | 2/2008 | Hausperger et al. ...... 324/117 H |
| 2006/0066292 A1 | | 3/2006 | Tadatsu |
| 2006/0158176 A1 | | 7/2006 | Preusse et al. |
| 2006/0290341 A1 | | 12/2006 | Hausperger et al. |
| 2007/0052407 A1 | | 3/2007 | Hausperger et al. |

FOREIGN PATENT DOCUMENTS

| | | |
|---|---|---|
| DE | 1209198 B | 11/1963 |
| DE | 4229065 A1 | 3/1994 |
| DE | 10105186 A1 | 8/2002 |
| DE | 10331883 A1 | 2/2005 |
| DE | 69434496 T2 | 6/2006 |
| DE | 102005024075 A1 | 11/2006 |
| DE | 102005040316 A1 | 3/2007 |
| EP | 0886147 A1 | 7/1997 |
| EP | 1067391 A1 | 1/2001 |
| EP | 1154277 A1 | 11/2001 |
| EP | 1450176 A1 | 8/2004 |
| GB | 1071848 | 6/1967 |
| WO | WO 2004/074860 A1 | 9/2004 |
| WO | WO 2005/106506 A1 | 11/2005 |

* cited by examiner

*Primary Examiner*—Ha Tran T Nguyen
*Assistant Examiner*—Trung Q Nguyen
(74) *Attorney, Agent, or Firm*—Wolf, Greenfield & Sacks, P.C.

(57) ABSTRACT

A device for measuring a current flowing in an electrical conductor that has a magnetic circuit coupled to an electrical conductor. The magnetic circuit has an air gap and a magnetic field sensitive component disposed in the air gap to measure a magnetic field generated by the electrical conductor. At least one control core with a control winding is included to control an effective length of the air gap when the control winding is energized. The device also has a compensation coil to magnetize the magnetic circuit.

25 Claims, 2 Drawing Sheets

DEVICE AND METHOD FOR MEASURING A CURRENT FLOWING IN AN ELECTRICAL CONDUCTOR

CROSS REFERENCE TO RELATED APPLICATION

Foreign priority benefits are claimed under 35 U.S.C. §119(a)-(d) or 35 U.S.C. §365(b) of German Application No. 10 2006 032 762.4, filed Jul. 14, 2006, which is hereby incorporated by reference in its entirety.

BACKGROUND OF THE INVENTION

1. Field

The present invention relates to a sensor for measuring a current flowing in an electrical conductor 2. Discussion of Related Art The rising number of electrical consumer loads in motor vehicles has created an ever-increasing demand for power in on-board electrical systems of vehicles. As a result, the load on the on-board battery, which serves as a backup during operation of the vehicle and maintains the vehicle's voltage supply when the engine is switched off, is becoming ever greater. These greater loads can lead to a failure to completely charge the battery during engine operation, particularly where the vehicle is subject to increased use for short-run operations. Such incompletely charged batteries can result in dead batteries, vehicle break downs, and/or an inability to start a vehicle due to a low battery voltage.

Energy management systems are increasingly being used in vehicles to prevent battery charging failures. Such energy management systems are intended to ensure that the charging condition of the battery does not reach a critical state and to ensure a positive charging balance of the battery. These systems perform analysis of the battery's condition, based on measured variables for battery current, battery voltage and battery temperature. In many systems, the detection of a charging or discharging current is significant in keeping the battery at a non-critical charge level to ensure the ability to start a vehicle.

The sensor shown in FIGS. 3 and 4 is known from the prior art for use in a motor vehicle for monitoring flowing currents. As shown, a measuring shunt 202 is inserted in earth conductor 201 to detect the battery current. An analyzing unit 203 directly measures the voltage drop at the measuring shunt and from this measurement calculates the level of current that is flowing. The measuring shunt may be made of Manganin.

FIG. 3 shows the measuring set-up associated with a sensor like that shown in FIG. 4. A car battery 205 is connected to the vehicle earth by way of an earth conductor 201. The sensor, comprising measuring shunt 202 and analyzing unit 203, is integrated into earth conductor 201. Electrical consumer loads 206 of the vehicle are connected to the positive pole of battery 205 by way of a conductor 207.

The sensor and configuration of FIGS. 3 and 4 do exhibit some disadvantages. The measuring shunt has to be integrated into the conductor that carries the current, which causes additional design expenditure since it is necessary to ensure that shear and tensile forces are not imparted to the measuring shunt. Deformation of the measuring shunt may influence the measured result and, in some cases, can lead to a fault in the sensor. Moreover, the configuration of FIGS. 3 and 4 necessarily incurs a heat loss via the measuring shunt. By way of example, even when using low resistances, such as those associated with a 100 mW measuring shunt, heat is still lost and has to be dissipated.

To overcome disadvantages in prior art designs, there is a need for a sensor that can detect the charging and/or discharging current over a very wide range, for example from −200 A to 1500 A. There is also a need for a suitable sensor, such as for use in energy management of a vehicle, that can cover this wide range of currents and have a high dynamic response.

SUMMARY

According to one aspect, a device for measuring a current flowing in an electrical conductor is disclosed. The device comprises a magnetic circuit that coupled to an electrical conductor. The magnetic circuit has an air gap and a magnetic field sensitive component disposed in the air gap. The magnetic field sensitive component measures a magnetic field generated by the electrical conductor. The device also includes at least one control core that has a control winding configured to control an effective length of the air gap when the control winding is energized. A compensation coil is configured to magnetize the magnetic circuit.

According to another aspect, a method for measuring a current flowing in an electrical conductor is disclosed. The method comprises providing a device that comprises a magnetic circuit that coupled to an electrical conductor. The magnetic circuit has an air gap and a magnetic field sensitive component disposed in the air gap. The magnetic field sensitive component measures a magnetic field generated by the electrical conductor. The device also includes at least one control core that has a control winding configured to control an effective length of the air gap when the control winding is energized. A compensation coil is configured to magnetize the magnetic circuit. The method also comprises energizing the compensation coil with a first polarity magnetization and measuring a first current through the electrical conductor. The compensation coil is energized with a second polarity magnetization and a second current through the electrical conductor is measured.

Various embodiments of the present invention provide certain advantages. Not all embodiments of the invention share the same advantages and those that do may not share them under all circumstances.

Further features and advantages of the present invention, as well as the structure of various embodiments of the present invention are described in detail below with reference to the accompanying drawings.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. Various embodiments of the invention will now be described, by way of example, with reference to the accompanying drawings, in which.

DETAILED DESCRIPTION OF THE DRAWINGS

Figure 1:
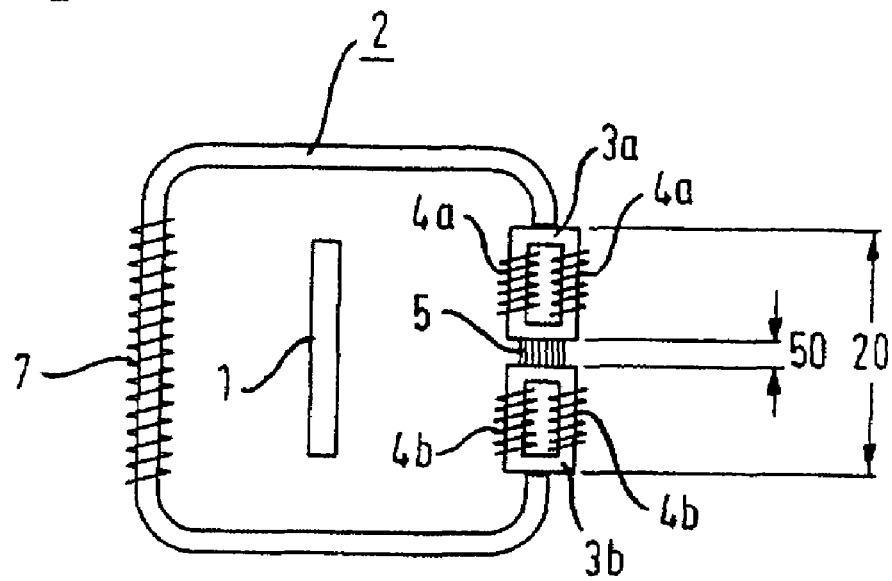
FIG. 1 is a schematic diagram of the device in a first embodiment having a compensation coil.

Aspect of the present invention include providing a device and a method for measuring a current flowing in an electrical conductor which addresses the drawbacks of the prior art and enables reliable measurement of a current in an electrical conductor over a broad measuring range.

According to one embodiment, the device has a magnetic circuit for coupling to the electrical conductor. The magnetic circuit includes an air gap, and a magnetic field sensitive component disposed in air gap. The magnetic field sensitive component is capable of measuring the magnetic field generated by the electrical conductor. The device may also include at least one control core that is disposed in the air gap of the magnetic circuit to control the air gap. The control core may have a control winding that, when energized, may cause the control core to become magnetically saturated in order to control the effective length of the air gap. A compensation coil for magnetizing the magnetic circuit may also be included in the magnetic circuit.

A remanence effect may occur in the magnetic circuit when the current to be measured changes direction of flow through the conductor to be measured, such as when the current changes from a positive current (discharging current) to a negative current (charging current). In other words, magnetization may persist inside the magnetic circuit when the current is switched off after currents have been measured in one direction. Embodiments of the magnetic circuit include materials with high saturation, which may increase the remanence effect. The remanence effect may also be higher for greater prior maximum current flows through the conductor. Remanence thus depends on both the intensity of the current that previously flowed through the magnetic circuit and on the material of the magnetic circuit. In the extreme case, the remanence may correspond to the maximum magnetic circuit saturation magnetization experienced when a particularly large current leads to the saturation of the magnetic circuit. That is, the remanence may assumes the maximum saturation magnetization value. However, the maximum remanence value is commonly lower than the greatest possible magnetization value of the magnetic circuit.

Remanence typically causes an offset error during measurement, in particular during the measurement after remanence occurs. This error is may also be dependent on the current direction through the conductor. The offset error of the remanence may shift the measured value in the positive or negative direction.

Offset error caused by the remanence effect can be compensated for by a compensation coil that magnetizes the magnetic circuit. The compensation coil may pre-magnetize or saturate the magnetic circuit before a measurement is carried out. In this respect, a remanence effect may be created in a controlled manner to a known level. This may prove particularly beneficial for magnetic circuits that measure current flowing in two different directions, such as the charging and discharging currents that flow through the electrical conductor to and from a battery. If a remanence effect is deliberately generated for measurement in both directions then the influence of the remanence may be compensated for mathematically by determining the mean value from the two measured values.

In one embodiment, a compensation coil of a magnetic circuit is configured such that the magnetic circuit saturation magnetization is greater than the amount of magnetization that may be produced by the coil. Such configurations may prevent the compensation coil from completely saturating the magnetic circuit. Here it is possible to use the compensation coil to create a magnetization below the maximum possible saturation value according to a first polarity and then according to an opposite polarity. The value of the remanence may then be reduced by determining the mean value. In such an embodiment, complete saturation of a specific magnetic material may also be avoided, which may make measurement of the remanence and/or current flows difficult.

The compensation coil may alternatively be configured to cause saturation of the magnetic circuit. In such embodiments, the remanence value may be consistently at the same level after switching-off of the compensation coil, since the magnetic circuit may be repeatedly brought to the same saturation value. The material of the material properties of the magnetic circuit will also typically remain constant, such that changes in the material properties may not alter the remanence value.

Embodiments may include a switching device that changes the polarization of the compensation coil. This may allow a remanence to be generated with both a positive and a negative polarity. A common current passing through the conductor for each of the polarities may be measured, and the value of the remanence deduced from the currents measured under each of the polarities.

The switching device may be coupled to a control device that controls switching of polarity in the compensation coil and measurements made by the device. Embodiments of the control device may be configured to provide for alternating operation of the compensation coil and measurement device. In this respect, the control device may prevent measurements from being made when the magnetic circuit is saturated by the compensation coil.

Embodiments may also include an analyzing device that is coupled to at least the magnetic field sensitive component and compensation coil. The analyzing device may be capable of exciting the control windings, and in this respect, may control the current measuring range of the device. According to some embodiments, the analyzing device is integrated into the magnetic field sensitive component.

Embodiments of the current measuring device may have a magnetic circuit that substantially surrounds the electrical conductor. The compensation coil and the magnetic field sensitive component may be positioned about the magnetic circuit on opposite sides of the electrical conductor. Such embodiments may provide a more compact measurement device. According to one illustrative embodiment, the current measuring device includes a "U" shaped magnetic circuit that substantially surrounds the electrical conductor, with the compensation coil positioned on a central portion or leg of the magnetic circuit, although other configurations are possible.

Two separate control cores may be disposed in the air gap with the magnetic field sensitive component disposed between the control cores, according to some embodiments. In such embodiments, the magnetic field sensitive component, such as hall-effects sensor, may be positioned in a central area of the effective air gap. Such an arrangement may position the magnetic field sensitive component at a low strength point of the magnetic field when both of the control cores are saturated, such that higher possible currents may be measured.

Embodiments with two separate control cores may also allow for a three-stage switching of the current measurement device. That is, the current measuring device may operate in a first mode in which no control cores are saturated, a second made in which a single control core is saturated, and a third mode in which both control cores are saturated.

When operating in the first mode, which has a higher sensitivity and may measure lower currents, the control windings are switched off and the magnetic field sensitive component measures the magnetic field carried in the overall magnetic circuit. Here, the overall magnetic circuit comprises the magnetic circuit and the control cores. In the third mode, when both control windings switched on, the magnetic field sensitive component may be positioned in the center of the effective air gap that lies between the furthest ends of the energized control cores. The magnetic field may be weakest at this position. As a result of the positioning of the sensor and/or the increase in size of the effective air gap, much greater currents may be measured by the current measuring device than when either of the control cores are not energized.

According to some methods, the current measuring device measures a current by first taking a current measurement with the compensation coil magnetizing the magnetic circuit according a first polarity, and then taking a second current measurement with the compensation coil magnetizing the magnetic circuit according to a second polarity.

The compensation coil may be used to completely saturate the magnetic circuit according to a first polarity. The coil may then be turned off and a first current measurement may be taken. The compensation coil may then completely saturate the magnetic circuit according to a second polarity, after which time the compensation coil is turned off such that a second current measurement may be taken. The first and second measurements may be used to determine the value of any remanence in the current measuring device. In this respect, corrections for any offset error associated with the remanence may be made, even when currents flowing in different directions along the electrical conductor are measured.

The first polarity magnetization and the second polarity magnetization may have the same magnitude and the same magnetization quantity. According to some embodiments, this may be achieved by saturating the magnetic circuit with the compensation coil in each of the first and second polarities. However, it is to be appreciated that similar effects may be accomplished without saturation of the magnetic circuit.

A magnetization having the same magnetization quantity, lower than the saturation remanence, may also be attained by applying a defined magnetization by means of a specific compensation coil current.

Where similar magnetization quantities are created through the compensation coil, a mean may be taken of the first and second current measurements, which will compensate for any remanence value in the measurements.

The first polarity magnetization and the second polarity magnetization may, according to some embodiments, have different magnitudes. This can result when the magnetic circuit is magnetized by different compensation coil currents. Additionally or alternatively, this may also result when the magnetic circuit comprises an inhomogeneous material that has different saturation remanences in a first and a second polarization. Such a configuration can be advantageous such as when compensation is desired for a known magnetic field that acts in a defined direction.

In embodiments that utilize first and second polarizations of different values, each of the first and second values may be weighted according to the magnetization quantity when the mean value is calculated to determine the amount of current flowing through the electrical conductor.

The current measuring device may be positioned near an earth conductor or a positive conductor of a vehicle battery, such as a motor vehicle battery. The device may also be disposed in the vicinity of an electrical load or a group of electrical loads of a vehicle. In such arrangements, the current measuring device may be used as a leak current monitor and a charging or discharging current monitor. Here, the device may be used to monitor the current consumption of individual loads or individual load groups in a vehicle. It is to be appreciated that the device may be used in other applications as well, as aspects of the invention are not limited in this respect.

According to some embodiments, the current measuring device may be used in a motor vehicle for monitoring currents in the vehicle's on-board electrical system.

Turn now to the figures and initially FIG. 1, which shows a schematic diagram of a first embodiment of a device for measuring a current flowing in an electrical conductor.

The device may be used to measure a current flowing through an electrical conductor 1. The device comprises a magnetic circuit 2, which has an air gap 20. Two control cores 3a and 3b are disposed in the air gap 20. It is, however, also possible to have a greater number of control cores, or only a single control core disposed in the air gap 20.

The control cores 3a and 3b, as shown, are directly connected to magnetic circuit 2 on respective sides that face towards magnetic circuit 2. In the embodiment shown, control cores 3a, 3b are designed as ferrite cores that form a substantially rectangular frame. Control windings 4a and 4b are attached, respectively, on two long sides of the substantially rectangular ferrite core frame 3a, 3b. A gap 50 is formed between the two control cores 3a, 3b, in which a magnetic field sensitive component 5 is disposed. In the illustrated embodiment, magnetic field sensitive component 5 is a Hall sensor, although other types of sensors may also be used. The two control cores 3a, 3b and magnetic field sensitive component 5 fill air gap 20 of magnetic circuit 2. In another exemplary embodiment (not shown), the gap 20 of magnetic circuit 2 is not completely filled but rather an actual air gap that lacks a physical element exists between the control cores and the magnetic field sensitive component. It is to be appreciated that the term "air gap", as used herein refers to the space between active portions of the magnetic circuit, and that the effective length of the air gap may be altered during operation, such as by energizing a control winding about a control core of the device.

A magnetic field sensitive component 5 is shown coupled into magnetic circuit 2 to measure the magnetic field surrounding electrical conductor 1, and thus to measure the current flowing through the electrical conductor.

Current flowing through conductor 1 in a first direction, may pre-magnetizes magnetic circuit 2 in a specific polarization. This pre-magnetization or remanence in magnetic circuit 2 may adulterate or distort the measurement of current through conductor 1 when the current reverses direction through conductor 1.

Compensation coil 7 may be provided on magnetic circuit 2 to compensate for the effects of remanence. The compensation coil 7 may be used to magnetize magnetic circuit 2 according to either a first or a second polarization, which may be accomplished by reversing the direction of the current flowing through compensation coil 7. The compensation coil 7 may be used to either completely saturate magnetic circuit 2 with a magnetic circuit saturation magnetization, and to thereby generate a maximum remanence in magnetic circuit 2, or to apply a magnetization to magnetic circuit 2 which is lower than the magnetic circuit saturation magnetization, as a result of which a remanence is applied that is lower than the maximum remanence.

The compensation coil 7 may be used to make a pair of successive current measurements in order to compensate for any remanence effects. Here, magnetic circuit 2 may be completely saturated with in a first polarity, by compensation coil 7. Then, compensation coil 7 may be switched off and a first measurement taken. Thereafter, compensation coil 7 may be energized with a second polarity to saturate the magnetic circuit in the opposite direction such that a remanence remains in the opposite direction after switching off compensation coil 7.

Taking measurements after the compensation coil has been energized with different polarities, and then switched off, allows the remanence value to be deduced by taking a mean of the two values. This may be accomplished when the compensation coil 7 is used to create a saturation remanence that may not typically be intensified by a current through the conductor 1. It is to be appreciated, however, that the magnetic circuit may be magnetized by the compensation coil to levels that are lower than saturation magnetization. Magnetizations at these levels are also controllable and can also be used to determining a mean value current value and a remanence value. However, in such scenarios, it may prove advantageous to have the magnetization levels greater than the magnetization levels that may be generated in magnetic circuit 2 by the maximum levels of current that are expected to be flowing through conductor 1.

When currents flowing through electrical conductor 1 are small, no current at all is applied to control windings 4a, 4b in order to set the device's sensitivity to high. The air gap of the effective magnetic circuit is then only in the order of magnitude of the air gap between the two control cores 3a, 3b, which corresponds to the width of component 5.

The magnetic field found in magnetic circuit 2 is sensed by the magnetic field sensitive component.

When large currents are to be measured, a control current may be applied to control coils 4a, 4b to saturate the control cores 3a, 3b. In doing so, the effective length of the air gap of magnetic circuit 2 corresponds to gap 20, as illustrated, since the saturated control cores do not contribute any more to the magnetic circuit. In this situation, magnetic field sensitive component 5 may be positioned in the centre of air gap 20 of magnetic circuit 2, where the magnetic field of magnetic circuit 2 may be weakest. Positioning the magnetic field sensitive component in this manner may facilitate measurement of especially large currents through electrical conductor 1 without exceeding the magnetic field sensitive component's dynamic response.

Figure 2:
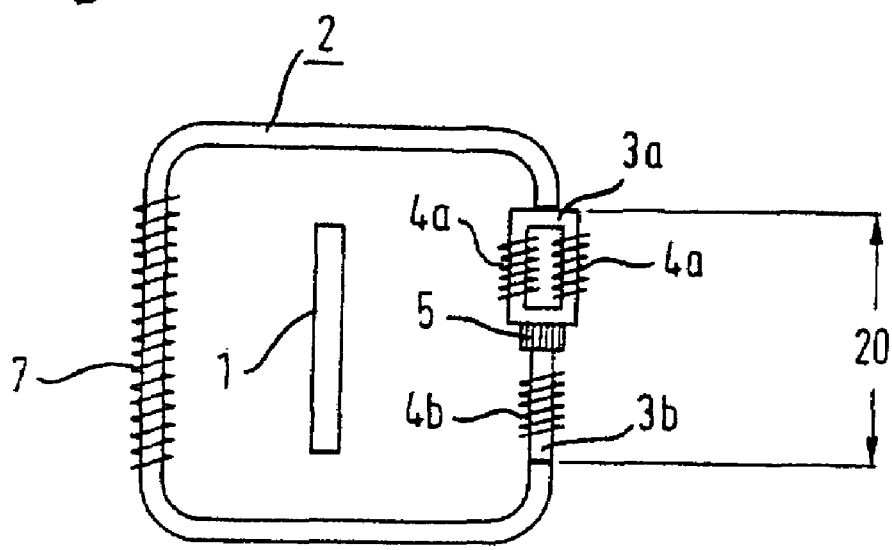
FIG. 2 is a schematic view of a current sensor in a second embodiment having a compensation coil.
Figure 3:
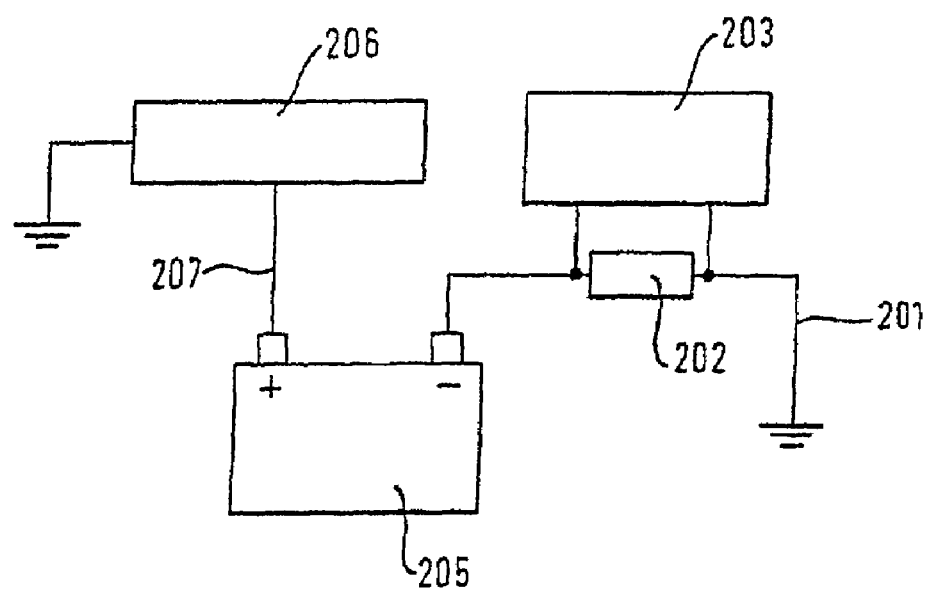
FIG. 3 is a schematic diagram of a sensor for measuring battery current according to the prior art.
Figure 4:
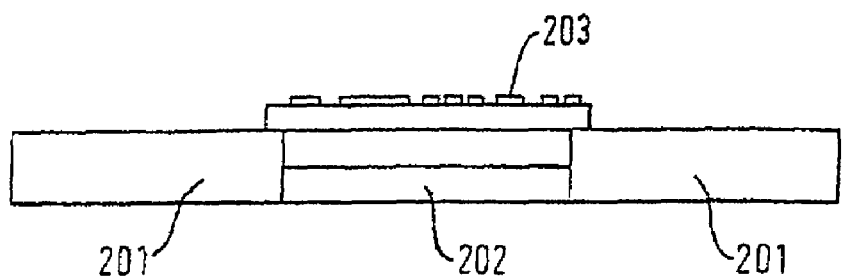
FIG. 4 is a sectional diagram of the measuring shunt and the analyzing unit from FIG. 3 according to the prior art.

FIG. 2 shows a second embodiment of the invention, which differs from that shown in FIG. 1 by the arrangement of the second control core 3b in respect of the first control core 3a. As shown, the plane lying within the frame of control core 3b is turned by 90 degrees vis-a-vis the plane lying within control core 3a. As a result it is possible to minimize the area of the air gap and thus further improve the sensitivity of the device for low currents. In the illustrated embodiment, the area of the air gap corresponds to a square area with a side length corresponding to the width of ferrite core frame 3a and 3b respectively. In such an embodiment, it may be possible to achieve additionally increased sensitivity at low currents.

The compensation coil 7 of the embodiment shown in FIG. 2 may operate in a similar manner to that as described above with regard to FIG. 1.

The magnetic field sensitive component 5 may be connected to an analyzing device (not shown) that includes a controller (not shown). The controller may be configured to separately excite control windings 4a, 4b, which may facilitate a measuring process that includes measuring the currents in a first measuring range with no excitation applied to control windings 4a, 4b, in a second measuring range where one of control windings 4a or 4b is charged with an excitation current to saturate the respective control cores 3a, 3b, and then in a third measuring range for measuring high currents where both control cores 3a, 3b are saturated by applying corresponding control currents to each of control windings 4a, 4b.

When both control cores are energized, the magnetic field sensitive component 5 may be positioned in the center of the effective air gap between portions of the magnetic circuit 2.

In other embodiments, more than two control cores may be disposed in the air gap such that by combining the respective saturation currents or by combining the respective saturations of the control cores different effective air gap lengths can be generated in respect of magnetic field sensitive component 5. As a result, it may be the measuring range of the device may be adapted to accommodate a wide variety of electric currents.

Embodiments of the device may be especially suitable for monitoring currents in motor vehicles due to the large measuring range switching.

Having thus described several aspects of at least one embodiment of this invention, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the descriptions and drawings herein are by way of example only.

What is claimed:

1. A device for measuring a current flowing in an electrical conductor, said device comprising:
    a magnetic circuit adapted to be coupled to an electrical conductor, the magnetic circuit having an air gap;
    a magnetic field sensitive component disposed in the air gap to measure a magnetic field generated by the electrical conductor;
    at least one control core having a control winding configured to control an effective length of the air gap when the control winding is energized; and
    a compensation coil configured to magnetize the magnetic circuit.

2. The device according to claim 1, wherein the magnetic circuit has a magnetic circuit saturation magnetization and the compensation coil is configured such that an amount of magnetization produced by compensation coil, when energized, is less than the magnetic circuit saturation magnetization.

3. The device according to claim 1, wherein the magnetic circuit has a magnetic circuit saturation magnetization and the compensation coil is configured such that the magnetic circuit saturation magnetization is attained when the compensation coil is energized.

4. The device according to claim 1, further comprising:
    a switching device for switching the polarization of the compensation coil.

5. The device according claim 4, wherein the switching device is coupled to a control device for controlling switching and measurement.

6. The device according to claim 1, further comprising:
    an analyzing device coupled to at least the magnetic field sensitive component and the compensation coil, the analyzing device comprising a controller configured to energize the control windings.

7. The device according to claim 6, wherein the analyzing device is integrated into the magnetic field sensitive component.

8. The device according to claim 1, wherein the magnetic circuit substantially surrounds the electrical conductor and the compensation coil and the magnetic field sensitive component are disposed in sections of the magnetic circuit that lie on opposite sides of the electrical conductor.

9. The device according to claim 8, wherein the magnetic circuit substantially has a U shape and the compensation coil is disposed on a central leg of the magnetic circuit.

10. The device according to claim 1, wherein the at least one control core comprises two control cores disposed in the air gap.

11. The device according to claim 10, wherein the magnetic field sensitive component is disposed between the control cores.

12. The device according to claim 1, wherein the device is disposed in the vicinity of a ground conductor or a positive conductor of a vehicle battery.

13. The device according to claim 1, wherein the device is disposed in the vicinity of an electrical consumer load or a group of electrical consumer loads of a vehicle.

14. A method for measuring a current flowing in an electrical conductor, the method comprising:
providing a device that comprises:
a magnetic circuit adapted to be coupled to an electrical conductor, the magnetic circuit having an air gap;
a magnetic field sensitive component disposed in the air gap to measure a magnetic field generated by the electrical conductor;
at least one control core having a control winding configured to control an effective length of the air gap when the control winding is energized; and
a compensation coil configured to magnetize the magnetic circuit; and
energizing the compensation coil with a first polarity magnetization;
measuring a first current through the electrical conductor;
energizing the compensation coil with a second polarity magnetization; and
measuring a second current through the electrical conductor.

15. The method according to claim 14, wherein the compensation coil is turned off after energizing the compensation coil with the first polarity and before measuring the first current, and wherein the compensation coil is turned off after energizing the compensation coil with the second polarity and before measuring the second current, the method further comprising:
determining a mean value of the first and second current measurements.

16. The method according to claim 14, wherein the first polarity magnetization and the second polarity magnetization each correspond to the saturation magnetization of the magnetic circuit.

17. The method according to one of claims 14, wherein the first polarity magnetization and the second polarity magnetization have the same magnetization quantity.

18. The method according to claim 17, wherein a mean value is determined from a first and a second measurement as a measured current value.

19. The method according to claim 14, wherein the first polarity magnatization and the second polarity magnetization are different.

20. The method according to claim 19, wherein a mean value of the first and second currents weighted with the respective magnetization quantities is determined in a first measurment and a second measurement as the measured current value.

21. The method according claim 14, wherein the magnetic circuit is completely saturated by the compensation coil between measuring the first current and measuring the second current.

22. The method according to claim 1, further comprising:
measuring a magnetic field in the magnetic circuit without exiting the control core; and
measuring a magnetic field in the magnetic circuit while the control core is saturated.

23. The method according to claim 22, wherein the at least one control core comprises two control cores provided in the air gap, the method further comprising measuring a magnetic field strength with saturation of only a single control core.

24. The method according to claim 23, wherein a measurement is initially performed with saturation of the first control core and then with saturation of the second control core.

25. A method of monitoring currents in a motor vehicle, the method comprising:
providing the device of claim 1; and
monitoring currents in an on-board electrical system of the motor vehicle.

* * * * *